(12) United States Patent
Ding et al.

(10) Patent No.: US 6,793,779 B2
(45) Date of Patent: Sep. 21, 2004

(54) SPUTTERING METHOD FOR FILLING HOLES WITH COPPER

(75) Inventors: Peijun Ding, San Jose, CA (US); Tony Chiang, Mountain View, CA (US); Barry L. Chin, Saratoga, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 10/369,856

(22) Filed: Feb. 20, 2003

(65) Prior Publication Data

US 2003/0157799 A1 Aug. 21, 2003

Related U.S. Application Data

(63) Continuation of application No. 08/855,059, filed on May 13, 1997, now Pat. No. 6,605,197.

(51) Int. Cl.[7] .......................... C23C 14/34; C23C 8/00; B05D 7/00
(52) U.S. Cl. .......................... 204/192.15; 204/192.17; 427/585; 427/404; 427/419.7
(58) Field of Search ................ 204/192.15, 192.17; 427/404, 585, 419.7

(56) References Cited

U.S. PATENT DOCUMENTS

| | | | |
|---|---|---|---|
| 4,756,810 A | 7/1988 | Lamont, Jr. et al. | 204/298.06 |
| 4,816,126 A | 3/1989 | Kamoshida et al. | 204/192.3 |
| 4,994,162 A | 2/1991 | Armstrong et al. | 204/192.3 |
| 5,108,570 A | 4/1992 | Wang | 204/192.3 |
| 5,171,412 A | 12/1992 | Talieh et al. | 204/298.11 |
| 5,246,885 A | 9/1993 | Braren et al. | 437/225 |
| 5,312,509 A | 5/1994 | Eschbach | 156/345 |
| 5,330,628 A | 7/1994 | Demaray et al. | 204/298.11 |
| 5,354,712 A | 10/1994 | Ho et al. | 437/195 |
| 5,372,848 A | 12/1994 | Blackwell et al. | 427/250 |
| 5,403,779 A | 4/1995 | Joshi et al. | 437/190 |
| 5,478,455 A | 12/1995 | Actor et al. | 204/192.13 |
| 5,573,682 A | 11/1996 | Beason, Jr. et al. | 219/121.5 |
| 5,585,673 A | 12/1996 | Joshi et al. | 257/751 |
| 5,639,357 A | 6/1997 | Xu | 204/298.06 |
| 6,139,697 A * | 10/2000 | Chen et al. | 204/192.15 |
| 6,605,197 B1 * | 8/2003 | Ding et al. | 204/192.15 |

OTHER PUBLICATIONS

S.M. Rossnagel et al., "Metal ion deposition from ionized magnetron sputtering discharge", *J. Vac. Sci. Technology B*, vol. 12, No. 1, Jan./Feb. 1994, pp. 449–453.

S.M. Rossnagel et al., "Thin high atomic weight refractory film deposition for diffusion barrier, adhesion layer, and see layer application", *J. Vac. Sci. Technology B*, vol. 14, No. 3, May/Jun. 1996, pp. 1819–1827.

S. Murarka et al., "Copper metallization for USLI and beyond", *Critical Reviews in Solid State and Materials Sciences*, vol. 20, No. 2, 1995, pp. 87–120.

* cited by examiner

Primary Examiner—Steven VerSteeg
(74) Attorney, Agent, or Firm—Charles S. Guenzer

(57) ABSTRACT

A method of filling trenches or vias on a semiconductor workpiece surface with copper using sputtering techniques. A copper wetting layer and a copper fill layer may both be applied by sputtering techniques. The thin wetting layer of copper is applied at a substrate surface temperature ranging between about 20° C. to about 250° C., and subsequently the temperature of the substrate is increased, with the application of the sputtered copper fill layer beginning at above at least about 200° C. and continuing while the substrate temperature is increased to a temperature as high as about 600° C. Preferably the substrate temperature during application of the sputtered fill layer ranges between about 300° C. and about 500° C.

27 Claims, 2 Drawing Sheets

SPUTTERING METHOD FOR FILLING HOLES WITH COPPER

RELATED APPLICATIONS

This application is a continuation of Ser. No. 08/855,059, filed May 13, 1997, now issued as U.S. Pat. No. 6,605,197.

FIELD OF THE INVENTION

The present invention pertains to the use of sputtering as a means for filling trenches and vias with copper (and alloys thereof). Sputtering techniques include Gamma copper ("long throw" deposition), IMP copper (ionized metal plasma deposition), coherent copper, and traditional (standard) copper deposition. In particular, when the sputtering of copper is carried out under particular process conditions, it is possible to fill feature sizes of 0.4 micron or less having aspect ratios of 1 or greater.

BACKGROUND ART

As the feature size of semiconductor patterned metal features has become increasingly finer, it is particularly difficult to use the techniques known in the art to provide multilevel metallurgy processing. In addition, future technological requirements include a switch from the currently preferred metallurgy of aluminum to copper, because of copper's lower resistivity and higher electromigration resistance. The standard reactive ion etching method frequently used for patterning a blanket metal cannot be practiced with copper, since there are no volatile decomposition products of copper at low temperatures (less than about 200° C.). The alternative deposition liftoff techniques are also limited in applicability in a copper structure, given the susceptibility of copper to corrosion by the lift-off solvents. Therefore a damascene structure is used which requires the filling of embedded trenches and/or vias.

A typical process for producing a multilevel structure having feature sizes in the range of 0.5 micron ($\mu$m) or less would include: blanket deposition of a dielectric material; patterning of the dielectric material to form openings; deposition of a conductive material onto the substrate in sufficient thickness to fill the openings; and removal of excessive conductive material from the substrate surface using a chemical, mechanical, or combined chemical-mechanical polishing techniques. Currently the conductive material is deposited using chemical vapor deposition (CVD), evaporation, and sputtering. Chemical vapor deposition, being completely conformal in nature, tends to create voids in the center of the filled opening, particularly in the instance of high aspect ratio features. Further, contaminants from the deposition source are frequently found in the deposited conductive material. Evaporation is successful in covering shallow features, but is generally not practical for the filling of high aspect ratio features. Sputtered copper, prior to the present invention, was not considered as a technique for filling of high aspect ratio openings, as voids typically occurred along the sidewalls of the openings. The sputtering technique included cold (typically below about 150° C.) deposition of sputtered copper so that the copper would adhere to the substrate surface, followed by an annealing process (without deposition) at temperatures in excess of about 400° C., to reflow the copper and obtain filling of the trench or via. However, such a reflow process takes hours, due to the low bulk diffusivity of copper.

U.S. Pat. No. 5,246,885 to Braren et al., issued Sep. 21, 1993, describes the problems listed above, and proposes the use of a laser ablation system for the filling of high aspect ratio features. Alloys, graded layers, and pure metals are deposited by ablating targets comprising more than one material using a beam of energy to strike the target at a particular angle. The ablated material is said to create a plasma composed primarily of ions of the ablated material, where the plasma is translated with high directionality toward a surface on which the material is to be deposited. The preferred source of the beam of energy is a UV laser. The heating of the deposition surface is limited to the total energy deposited by the beam, which is said to be minimal.

U.S. Pat. No. 5,312,509 of Rudolph Eschbach, issued May 17, 1974, discloses a manufacturing system for low temperature chemical vapor deposition of high purity metals. In particular, a semiconductor substrate including etched patterns is plasma cleaned; subsequently, the substrate is coated with adhesion and nucleation seed layers. A reactor connected to the process chamber containing the substrate sublimes a precursor of the metal to be deposited, which is then transported to the substrate. A reactor heat transfer system provides selective reactor cooling and heating above and below the precursor sublimation temperature under the control of programmable software. The heated chuck on which the substrate sits heats the substrate above the dissociation temperature of the precursor, releasing the metal from the precursor onto the substrate to nucleate the metal species onto the seed layer on the substrate. Then the system is pumped to a lower pressure and the substrate is advanced to the next process chamber. This manufacturing system is recommended for the chemical vapor deposition of pure copper at low temperatures. Although an adhesion barrier layer (and a sputtered seed layer if required) are said to be deposited using sputter deposition, the copper layer is applied solely by CVD deposition, to avoid the sidewall voiding which is said to occur if sputtering is used for the copper deposition. The CVD copper deposition is carried out using a wafer temperature controlled within a temperature range of 120° C. to 250° C. during the nucleation of the metal species upon the substrate (with the temperature being lower at other times during the process).

U.S. Pat. No. 5,354,712 to Ho et al., issued Oct. 11, 1994, describes a method for forming interconnect structures for integrated circuits. Preferably, a barrier layer of a conductive material which forms a seed layer for metal deposition is provided selectively on the sidewalls and bottom of interconnect trenches defined in a dielectric layer. Subsequently, a conformal layer of metal is selectively deposited on the barrier layer within the interconnect trench. The metal layer comprises copper which is deposited by chemical vapor deposition from an organo-metallic precursor at temperatures. In particular, the layer of copper is deposited by CVD from copper (hexafluoroacetylacetonate) trimethyl vinylsilane compound by pyrolysis at low temperatures, between about 120° C. and 400° C., onto a conductive barrier layer of sputtered titanium nitride (TiN) which lines via holes, providing a seed layer for selective growth of the conformal layer of copper. The temperature of the substrate surface on which the conductive barrier layer resides does not appear to be specified.

In any case, this process suffers from the conformal deposition of the metallic layer which tends to cause voids in the center of the filled opening, as previously described, and from the presence of contaminant residues from the precursor material which remain in the deposited metallic fill.

U.S. Pat. No. 5,585,673, issued to Joshi et al. on Dec. 17, 1996, discloses refractory metal capped low resistivity metal conductor lines and vias. In particular, the low resistivity metal is deposited using physical vapor deposition (e.g., evaporation or collimated sputtering), followed by chemical vapor deposition (CVD) of a refractory metal cap. Recommended interconnect metals include $Al_x Cu_y$ (wherein the sum of x and y is equal to one and both x and y are greater than or equal to zero). The equipment required for collimated sputtering is generally difficult to maintain and difficult to control, since there is a constant build up of sputtered material on the collimator over time. Collimated sputtering is described in U.S. Pat. No. 5,478,455 to Actor et al., issued Dec. 26, 1995. Collimation, whether for sputtering or evaporation, is inherently a slow deposition process, due to the reduction in sputtered flux reaching the substrate.

It would be highly desirable to have a sputtering process for copper deposition which uses a substantially standard sputtering process chamber and target, while providing a complete fill of vias and trenches.

SUMMARY OF THE INVENTION

It has been discovered that the surface diffusion characteristics of copper over a particular temperature range enable the complete filling of vias and trenches using sputtering techniques previously believed incapable of achieving such filling.

In particular, the copper fill layer may be applied in a single step process or in a two step process. In the single step process, for feature sizes of about 0.75 μm or less, when the aspect ratio of the feature to be filled is less than approximately 3:1, the temperature of the substrate to which the copper fill layer is applied should range from about 200° C. to about 600° C. (preferably from about 200° C. to about 500° C.); when the aspect ratio is about 3:1 or greater, the copper fill layer should be applied over a temperature ranging from about 200° C. to about 600° C. (preferably from about 300° C. to about 500° C.). The deposition can be initiated at the low end of the temperature range, with the temperature being increased during deposition.

In the two step process, a thin, continuous wetting (bonding) layer of copper is applied at a substrate surface temperature of about 20° C. to about 250° C. The wetting layer thickness (on the wall of the trench or via) should be a minimum of about 5 nm, and typically may be about 10 nm to about 30 nm, depending on feature size and aspect ratio. Subsequently, the temperature of the substrate is increased, with the application of fill copper beginning at about 200° C. or higher and continuing as the temperature is increased to that appropriate for the feature size. When both the copper wetting layer and the copper fill layer are applied in a single process chamber, the deposition may be a continuous deposition. In such case, process conditions are varied during the deposition, with the copper fill layer being applied at a slower rate than the copper wetting layer, to provide better deposition control.

When the copper wetting layer is applied in one process chamber and the copper fill layer is applied in a second process chamber, typically the substrate with copper wetting layer already applied is placed on a heated support platen in the second process chamber. For a small feature size (0.5 μm or less) and an aspect ratio of 1:1 or greater, it is better to wait until the substrate is heated to a temperature of at least 200° C. prior to beginning application of the copper fill layer, or to begin the fill layer deposition at a slower rate while the substrate is heating.

The selection of a single step process or a two step process depends on the composition and structure of the surface upon which the copper is being deposited and the feature size of the trench or via to be filled.

The copper sputtering technique used in the single step process is selected from Gamma deposited copper, Coherent copper, IMP copper, and traditional standard sputter deposition copper.

The copper deposition method used for application of the thin, continuous, wetting layer of copper in the two step process may be one of the sputtered copper techniques listed above or may be chemical vapor deposition (CVD) copper or evaporation deposited copper, depending on the feature size of the trench or via to be filled. The deposition method used for the copper fill layer is selected from the sputtering techniques listed above, to provide a more contaminant-free and more rapid filling of the trench or via.

DETAILED DESCRIPTION OF THE PREFERRED EMBODIMENTS

Figure 1:
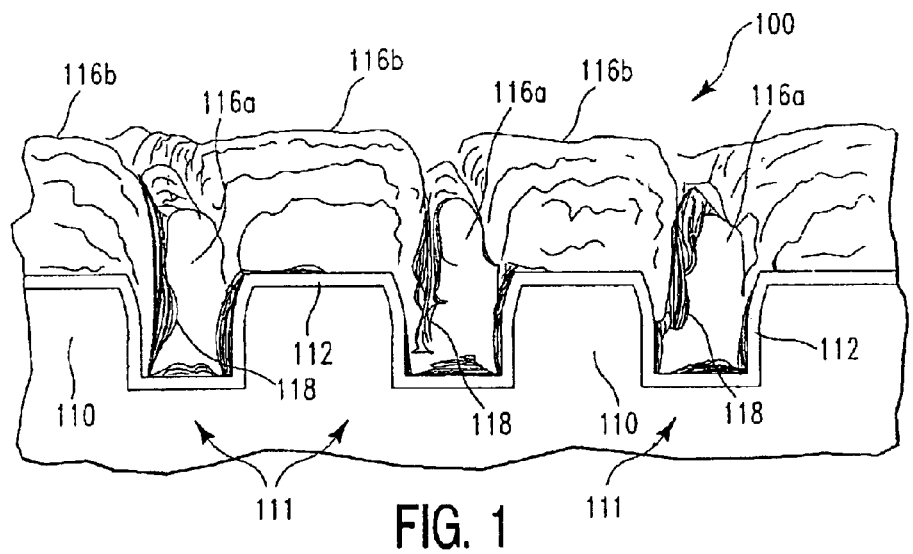
FIG. 1 shows a schematic of a scanning electron microscope (SEM) cross-sectional image of a silicon oxide substrate having trenches in its surface, with a barrier layer deposited over the substrate surface and a Gamma-sputtered copper fill layer overlying the barrier layer. The substrate surface temperature was approximately 50° C. at the time the copper fill layer was applied.

The present disclosure pertains to a method of filling semiconductor structure trenches and vias with sputtered copper, wherein the surface diffusion characteristics of copper over a particular temperature range enable the complete filling of vias and trenches using sputtering techniques previously believed incapable of achieving such filling.

I. Definitions

As a preface to the detailed description, it should be noted that, as used in this specification and the appended claims, the singular forms "a", "an", and "the" include plural referents, unless the context clearly dictates otherwise. Thus, for example, the term "a semiconductor" includes a variety of different materials which are known to have the behavioral characteristics of a semiconductor, reference to a "plasma" includes a gas or gas reactants activated by an RF or DC glow discharge, and reference to "copper" includes alloys thereof.

Specific terminology of particular importance to the description of the present invention is defined below.

The term "aspect ratio" refers to the ratio of the height dimension to the width dimension of particular openings into which an electrical contact is to be placed. For example, a via opening which typically extends in a tubular form through multiple layers has a height and a diameter, and the aspect ratio would be the height of the tubular divided by the diameter. The aspect ratio of a trench would be the height of the trench divided by the minimal width of the trench at its base.

The term "coherent copper" refers to copper which is applied using a collimated deposition technique.

The term "completely filled" refers to the characteristic of the copper-filled feature, wherein there is essentially no void space present in the copper-filled feature.

The term "copper" refers to copper and alloys thereof, wherein the copper content of the alloy is at least 80 atomic %. The alloy may comprise more than two elemental components.

The term "feature" refers to contacts, vias, trenches, and other structures which make up the topography of the substrate surface.

The term "Gamma" or "γ sputtered copper" or "Gamma copper" refers to non-collimated magnetron sputtered copper which is sputtered at low process chamber (gas) pressures, with improved directionality of the depositing atoms. The improved directionality is achieved by increasing the distance between the target cathode and the workpiece surface (the throw) and by reducing the process gas pressure during sputtering. Typically the distance between the substrate and the target is about the diameter of the substrate or greater; and, preferably, the process gas pressure is sufficiently low that the mean free path for collision within the process gas is greater than the distance between the target and the substrate.

The term "ion-deposition sputtered" and the term "ion metal plasma (IMP) refer to sputter deposition, preferably magnetron sputter deposition (where a magnet array is placed behind the target). A high density, inductively coupled RF plasma is positioned between the sputtering cathode and the substrate support electrode, whereby at least a portion of the sputtered emission is in the form of ions at the time it reaches the substrate surface.

The term "IMP sputtered copper" or "IMP copper" refers to a copper deposition which was sputtered using the IMP sputter deposition process.

The term "reactive ion deposition" or "reactive ion metal plasma (IMP)" refers to ion-deposition sputtering wherein a reactive gas is supplied during the sputtering to react with the ionized material being sputtered, producing an ion-deposition sputtered compound containing the reactive gas element.

The term "SEM" refers to a scanning electron microscope.

The term "standard copper deposition" refers to copper deposited using traditional sputtering techniques.

The term "traditional sputtering" refers to a method of forming a film layer on a substrate wherein a target is sputtered and the material sputtered from the target passes between the target and the substrate to form a film layer on the substrate, and no means is provided to ionize a substantial portion of the target material sputtered from the target before it reaches the substrate. One apparatus configured to provide traditional sputtering is disclosed in U.S. Pat. No. 5,320,728, the disclosure of which is incorporated herein by reference. In such a traditional sputtering configuration, the percentage of target material which is ionized is less than 10%, more typically less than 1%, of that sputtered from the target.

II. An Apparatus for Practicing the Invention

A process system in which the method of the present invention may be carried out is the Applied Materials, Inc. (Santa Clara, Calif.) Endura® Integrated Processing System. The system is shown and described in U.S. Pat. Nos. 5,186,718 and 5,236,868, the disclosures of which are incorporated by reference.

The sputtering processes referenced herein are generally known in the art. Gamma sputtering is described in detail in U.S. Pat. No. 5,516,403, and by S. M. Rossnagel and J. Hopwood in their paper titled "Thin, high atomic weight refractory film deposition for diffusion barrier, adhesion layer, and seed layer applications" J. Vac. Sci. Technol. B 14(3), May/June 1996. The IMP sputtering process is presented by S. M. Rossnagel and J. Hopwood in "Metal ion deposition from ionized mangetron sputtering discharge, J. Vac. Sci. Technol. B, Vol. 12, No. 1 (January/February 1994). Coherent sputtering and traditional sputtering are well known in the art.

III. The Structure of the Copper Filled Trench or Via

We have been able to create a completely filled trench or via having a feature size of about 0.4 μm and an aspect ratio of greater than 1:1 (up to about 3:1 presently). The trench or via may be filled using any of the sputtering techniques described above, including standard traditional sputtering. The present method is expected to provide a complete fill for smaller feature sizes, but these have yet to be evaluated. The copper-filled trench or via exhibits excellent sidewall wetting with a void-free fill, when filled in accordance with the method disclosed herein.

Although the background art cited reported that trenches and vias could not be completely filled using sputtering techniques, we discovered that by controlling the surface diffusion characteristics of copper over a particular temperature range, we could enable the complete filling of vias and trenches using such sputtering techniques.

Depending on the dielectric material used in contact with the copper, it may be necessary to use a barrier layer between the copper and the dielectric material. For example, it is well known in the art that it is necessary to use a barrier layer between silicon oxide and copper. We have determined that when the trench or via surface is silicon oxide, a barrier layer selected from tantalum, tantalum nitride, tantalum-silicon nitride, titanium nitride, titanium-silicon nitride, tungsten nitride and tungsten-silicon nitride prevents diffusion of copper into the silicon oxide while permitting a complete copper fill of the small feature sizes described herein, using the method described herein. In cases where it is difficult for copper to adhere to a barrier layer, a wetting layer may be used over the surface of such a barrier layer. For example, and not by way of limitation, we have discovered that aluminum and titanium provide excellent wetting layers in contact with either a copper wetting layer or a copper fill layer.

Although a barrier layer or a wetting layer (when present) affects the ability of the copper to flow into and fill a trench or via, the control of the copper deposition temperature has the greatest effect on obtaining a completely filled feature. The effect of the barrier layer surface or the barrier layer with overlying wetting layer surface is believed to be a second order effect, whereas the copper deposition temperature has a first order effect.

Figure 2:
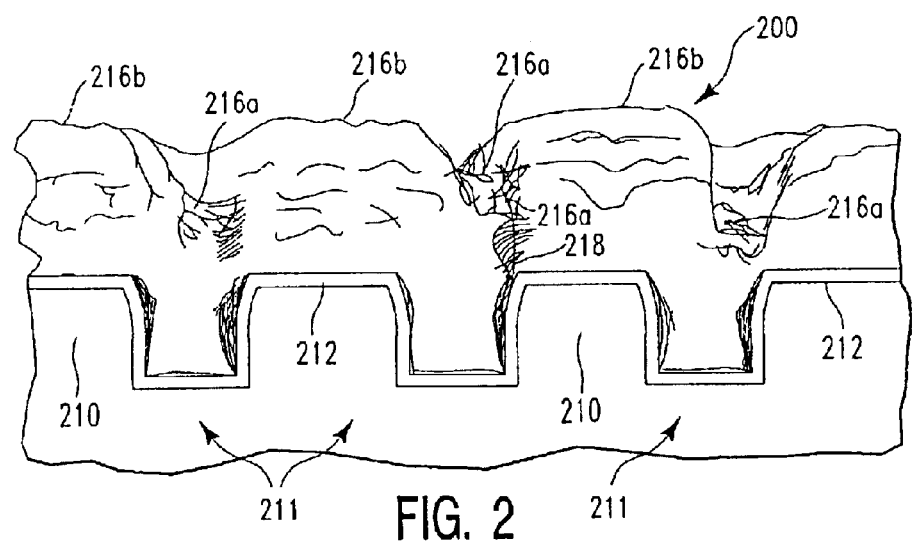
FIG. 2 shows a schematic of an SEM cross-sectional image of the same copper-filled trench composite structure as that shown in FIG. 1, but where the substrate surface temperature was approximately 170° C. at the time the copper fill layer was Gamma sputtered.
Figure 3:
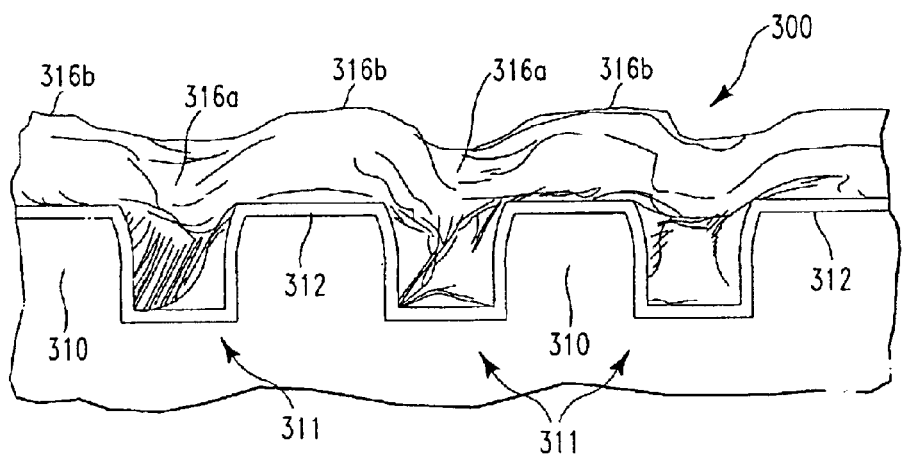
FIG. 3 shows a schematic of an SEM cross-sectional image of the same copper-filled trench composite structure as that shown in FIGS. 1 and 2, but where the substrate surface temperature was approximately 325° C. at the time the copper fill layer was applied.

FIGS. 1–3 show a schematic depicting an SEM cross-sectional view of a silicon oxide substrate having copper-filled trenches in its surface, where the trenches are lined with a tantalum nitride barrier layer (which was deposited using the Gamma sputtering technique) prior to application of the copper fill layer.

Figure 4A:
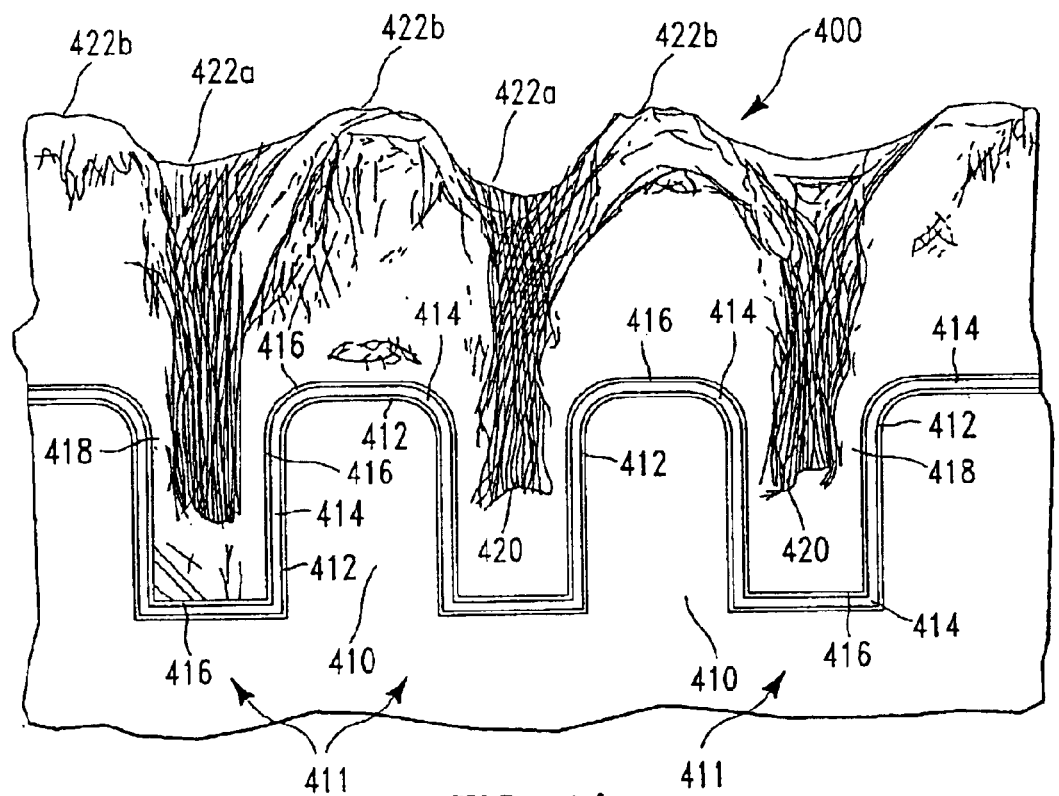
FIG. 4A shows a schematic of a scanning electron microscope (SEM) cross-sectional image of a silicon oxide substrate having trenches in its surface, with a barrier layer of tantalum deposited over the oxide surface, a wetting layer of aluminum deposited over the tantalum surface, a second wetting layer of IMP copper deposited over the aluminum wetting layer, and a copper fill layer of Gamma sputtered copper deposited over the wetting layer of IMP copper. The IMP copper was deposited with the substrate surface at about 250° C. and the Gamma copper was deposited with the substrate surface at about 325° C. The feature size for the trench is approximately 0.75 μm wide and 1.5 μm deep.
Figure 4B:
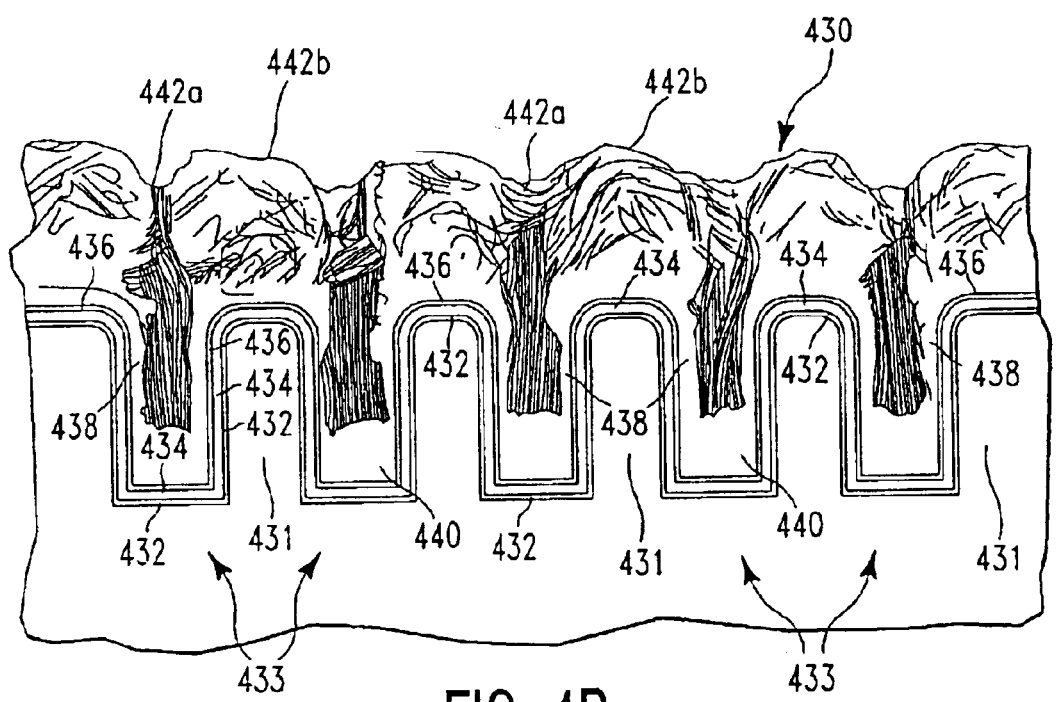
FIG. 4B shows a schematic of a scanning electron microscope (SEM) cross-sectional image of the same structure as that described above, except that the feature size for the trench is approximately 0.5 μm wide and 1.5 μm deep. The IMP copper wetting layer was deposited with the substrate surface at approximately 300° C. and the Gamma copper fill layer was deposited with the substrate surface at about 325° C.

FIGS. 4A and 4B show a schematic depicting a SEM cross-sectional view of a silicon oxide substrate having copper-filled trenches in its surface, where the trenches are lined with a Gamma-sputtered tantalum barrier layer which is overlaid with a Gamma-sputtered aluminum wetting layer, followed by an IMP sputtered second wetting layer of copper, and filled with Gamma-sputtered copper.

One skilled in the art can envision a number of possibilities ranging from a direct application of the sputtered copper fill layer over an underlying dielectric substrate; to application of a copper wetting layer over the substrate, followed by the sputtered copper fill layer; to various combinations of barrier layers and wetting layers used with either a copper wetting layer and/or a sputtered copper fill layer.

IV. The Method of Application of Sputtered Copper Fill

When the underlying substrate in contact with copper is susceptible to diffusion by copper, the sputtered copper fill is preferably applied over a barrier layer, perhaps with a wetting layer overlaying the barrier layer. Silicon oxide is commonly used as a dielectric in semiconductor structures, and silicon oxide is subject to diffusion by copper. With this in mind, the preferred embodiments described herein are with reference to a silicon oxide substrate having an overlying barrier layer. However, it is understood that should a dielectric substrate be used which is not subject to diffusion by copper, such a barrier layer would not be necessary. A barrier layer or a wetting layer (or both) applied over a silicon oxide surface may be applied by any technique known in the art, including CVD and evaporation, since the major drawbacks previously mentioned with regard to these application techniques is minimized when the underlying layer is a sufficiently thin layer.

The preferred embodiments described herein were produced in an IMP process chamber capable of processing a 200 mm-diameter silicon wafer. The substrate was a silicon wafer having a silicon oxide surface patterned with trenches and vias in the surface of the silicon oxide.

IMP sputtering was carried out using a copper target cathode having a 13.37 inch (33.96 cm) diameter, and DC power was applied to this cathode over a range from about 1 kW to about 5 kW. The substrate was placed a distance of about 5.5 inches (14 cm) from the copper target cathode. Typically a substrate bias voltage ranging from 0 to about −100 V AC was applied to the substrate or the support platen under the substrate to create a bias which attracts ions from the plasma to the substrate. The AC bias power ranged from 0 W to about 500 W, and the frequency was typically from 350 kHz to 13.56 MHz. A high density, inductively coupled RF plasma was generated in the region between the target cathode and the substrate by applying RF power to a coil (having from 1 to 3 turns) over a range from about 400 kHz to about 13.56 MHz (preferably about 2 MHz), at a wattage ranging from about 0.5 kW to about 5 kW (preferably about 1 kW to about 3 kW). The atmosphere in the process vessel was argon, the flow rate of the argon ranged from about 6 sccm to about 140 sccm, and the process vessel pressure ranged from about 5 mT to about 60 mT.

Gamma sputtering was carried out using the following conditions: The DC power to the target ranged from about 1 kW to about 18 kW. The spacing between the target and the substrate ranged between about 150 mm and about 500 mm, with or without a chimney between the target and the substrate. (A chimney is a cylinder or plurality of concentric cylinders placed between the substrate and the target to block the center of the substrate from the edge of the target and the edge of the substrate from the center of the target, to increase deposition uniformity.) There was no bias applied to the substrate. The atmosphere in the process vessel was argon and the pressure ranged from about 0.1 mT to about 5 mT. The lower the pressure, the better the bottom coverage.

Coherent sputtering was carried out using the following conditions: The DC power to the target ranged from about 1 kW to about 22 kW. The collimator aspect ratio ranged from about 0.5:1 to about 2:1 (with 1:1 being preferred). The spacing between the target and the substrate ranged from about 90 mm to about 120 mm. There was no bias applied to the substrate. The atmosphere in the process vessel was argon and the pressure ranged from about 0.1 mT to about 5 mT.

Standard sputtering was carried out using the following conditions: The DC power to the target ranged from about 1 kW to about 18 kW. The spacing between the target and the substrate ranged from about 40 mm to about 60 mm. There was no bias applied to the substrate. The atmosphere in the process vessel was argon and the pressure ranged from about 0.1 mT to about 5 mT.

EXAMPLE ONE

FIGS. 1–3 show a schematic of a cross-sectional SEM (100, 200, and 300, respectively) of a silicon oxide substrate (110, 210, and 310, respectively) having copper-filled trenches (111, 211, and 311, respectively) in its surface. A barrier layer (112, 212, and 312, respectively) of $TaN_x$, where x ranged between 0 and 1, was deposited on the surface of the silicon oxide substrate to a thickness of about 50 nm (the thickness of the $TaN_x$, on the sidewall of the trenches ranged from about 15 to about 30 nm). The copper fill layer was gamma sputtered to a surface layer thickness of about 1.2 μm. The trench (feature) size in all cases was 0.5 μm wide and 0.5 μm deep.

In FIG. 1, the copper fill was gamma sputtered (to provide better bottom coverage) at a substrate temperature of about 50° C. (100° C. heater temperature) The sputtered copper layer 116a in the area of the trenches 111 formed distinct mounds which did not flow well, leaving voids 118 in the fill. In addition there were distinct breaks between the copper layer 116a in the area of the trenches 111 and the copper layer 116b in surrounding areas, further indicating that the copper did not flow sufficiently well to enable the complete filling of trenches 111.

In FIG. 2, the gamma sputtered copper was applied at a substrate temperature of about 170° C. (220° C. heater temperature). The sputtered copper layer 216 (a and b) flowed better, but a few minor voids 218 were present in the trench fill, indicating that optimum copper flow had not yet been attained. The definition between the copper layer 216a overlying the trenches and the copper layer 216b in the area surrounding the trenches was less, indicating that the sputtered copper was flowing better than it had at 50° C. (as illustrated by FIG. 1).

In FIG. 3, the gamma sputtered copper was applied at a substrate temperature of about 325° C. (375° C. heater temperature) The sputtered copper layer 316 (a and b) flowed very well, with no voids observed in the trench fill, indicating that satisfactory, if not optimum copper flow had been attained. The definition between the copper fill 316a overlying the trenches and the copper layer 316b in the area surrounding the trenches was minimal, indicating that the sputtered copper was flowing adequately to enable complete trench filling.

In all three of the preferred embodiments described above, the sputtered copper fill did not separate from the side wall of the trench. This is in contrast with previous sputtering techniques where the copper was initially deposited cold, at a substrate temperature of less than about 150° C., followed by a reflow process step (without additional copper deposition) at a temperature in excess of 400° C. Typically, the cold deposition followed by a reflow process step resulted in separation of the fill from the trench wall (i.e. voiding).

EXAMPLE TWO

FIGS. 4A and 4B show a schematic of a cross-sectional SEM (400 and 430, respectively) of a silicon oxide substrate (410 and 431, respectively) having copper-filled trenches (411, and 433, respectively) in its surface. A barrier layer (412 and 432, respectively) of Gamma-sputtered tantalum was deposited to a substrate surface thickness of about 80 nm (a sidewall thickness ranging from about 20 nm to about 40 nm) over the silicon oxide substrate. (Had a tantalum nitride barrier layer been used, the preferred method of application would have been reactive IMP sputtering in the presence of nitrogen). A wetting layer (414 and 434, respectively) of Gamma-sputtered aluminum, was deposited to a substrate surface thickness of about 100 nm (a sidewall thickness ranging from about 10 nm to about 30 nm) over the tantalum barrier layer. This was followed by a second wetting layer of IMP-sputtered copper (416 and 436, respectively), which was applied to a substrate surface thickness of about 180 nm (a sidewall thickness ranging from about 35 nm to about 50 nm), at a substrate temperature of about 250° C. The copper fill layer was IMP sputtered to a substrate surface thickness of about 1 μm. The trench (feature) size in FIG. 4A was about 0.67 μm wide and 1.2 m deep. The trench size in FIG. 4B was about 0.4 μm wide and 1.2 μm deep.

With reference to FIG. 4A, the thin, second wetting layer of IMP-sputtered copper layer 416 was sputtered over the aluminum wetting layer 414 at a substrate temperature of about 250° C. The substrate was subsequently transferred to a second process chamber (which did not have the IMP ionization coil), for Gamma sputtering of the copper fill layer. The substrate temperature was raised to about 325° C. for application of the Gamma-sputtered copper layer 422 (a and b). The surface thickness of the Gamma-sputtered copper layer 422 (a and b) applied was about 1 μm, as previously mentioned. The Gamma-sputtered copper 418 traveled nicely over the surface of the IMP-sputtered copper layer 416, down toward the pool 420 of Gamma-sputtered copper in the bottom of the trench 411. The slope from the upper surface 422b of the copper layer toward the lower surface 422a of the copper layer overlying trenches 411 was gradual, indicating good flow of the copper into the trenches 411.

With reference to FIG. 4B, the thin, second wetting layer of IMP-sputtered copper layer 436 was sputtered over the aluminum wetting layer 434 at a substrate temperature of about 250° C. The substrate was subsequently transferred to a second process chamber for Gamma sputtering of the copper fill layer. The substrate temperature was raised to about 325° C. for application of the Gamma-sputtered copper layer 442 (a and b). The thickness of the Gamma-sputtered copper layer 442 (a and b) applied was about 1 μm. The Gamma-sputtered copper 438 traveled nicely over the surface of the IMP-sputtered copper layer 436, down toward the pool 440 of Gamma-sputtered copper in the bottom of the trench 433. The slope from the upper surface 442b of copper layer 442 toward the lower surface 442a of copper layer 442 overlying trenches 433 was gradual, indicating good flow of the copper into the trenches.

In both of the above-described experiments, the Gamma-sputtered copper would be expected to completely fill the trenches to a height at least as high as the upper substrate surface barrier and wetting layers if a thicker layer of copper were applied.

Although the barrier layer applied in this example was tantalum, we have also tried tantalum nitride and titanium nitride, and found these materials to work well. One skilled in the art can choose from known barrier layers. Although the wetting layer applied in this Example was aluminum, applicants have also used titanium and found that titanium works well as a wetting layer. Additional wetting layers are known in the art.

The selection of a particular barrier layer or a barrier layer combined with a wetting layer determines the need for deposition of a thin (ranging between about 20 nm and about 100 nm) wetting layer of copper prior to application of the sputtered copper fill layer. When the sputtered copper fill tends to dewet from the barrier layer easily, then either a single wetting layer such as aluminum or copper, or a dual wetting layer such as a layer of aluminum overlaid by a layer of copper may be needed. For example, when a tantalum barrier layer is used in combination with an overlying aluminum wetting layer, it is possible to Gamma-sputter a copper fill layer directly over the aluminum layer at a temperature of about 375° C. When a tantalum barrier layer alone is used, the direct application of a Gamma-sputtered copper fill layer at 375° C. provides marginal fill characteristics. When a tantalum nitride barrier layer is used, a thin wetting layer of copper can be used to prevent subsequent dewetting of a Gamma-sputtered fill from the trench sidewalls.

On the basis of empirical data, the preferable substrate temperature for application of the thin wetting layer of copper ranges between about 25° C. and about 250° C. The copper wetting layer can be applied using the following techniques: IMP copper, CVD copper, Gamma-sputtered copper, Coherent copper, or traditionally sputtered copper. The preferable substrate temperature for sputtering of the copper fill layer ranges between about 200° C. and 600° C., with a range between about 300° C. and 500° C. being even more preferred. The sputtered copper fill layer can be applied using the following techniques: Gamma-sputtered copper, IMP copper, Coherent copper and traditionally sputtered copper.

The above described preferred embodiments are not intended to limit the scope of the present invention, as one skilled in the art can, in view of the present disclosure expand such embodiments to correspond with the subject matter of the invention claimed below.

What is claimed is:

1. A method of filling copper into a hole formed in a dielectric layer in a substrate, comprising the steps of:
   a first step of sputtering copper into said hole to form a copper layer on walls of said holes while said substrate is held at a first temperature; and a second step of sputtering copper into said hole to fill said hole with copper while holding said substrate at a second temperature higher than said first temperature and in a range of between 200° and 600° C.

2. The method of claim 1, wherein said second temperature is in a range of between 300° and 500° C.

3. The method of claim 2, wherein said first temperature is no more than 250° C.

4. The method of claim 1, wherein said two sputtering steps are performed respectively in first and second sputter reactors.

5. The method of claim 4, wherein said first sputtering step includes inductively coupling RF power into said first sputter reactor.

6. The method of claim 5, wherein said second sputtering step is performed in said second reactor producing less than 10% ionization of copper from a target within said second sputter reactor.

7. The method of claim 1, wherein said second sputtering step is performed in a reactor producing less than 10% ionization of copper from a target within said sputter reactor.

8. The method of claim 1, further comprising depositing a barrier layer on said walls prior to said first sputtering step.

9. The method of claim 8, wherein said depositing step comprises sputtering a material comprising an element selected from the group consisting of tantalum and titanium.

10. The method of claim 9, wherein said element is tantalum.

11. The method of claim 8, wherein said barrier layer comprises tantalum nitride.

12. The method of claim 8, wherein said depositing step comprises sputtering a material comprising the element of tungsten.

13. The method of claim 1, where a barrier layer comprising tantalum is disposed on said walls prior to said first sputtering step.

14. The method of claim 1, wherein said copper layer is deposited to a thickness of between 20 and 100 nm.

15. A method of filling copper into a hole formed in a dielectric layer in a substrate, comprising the steps of:

a first step performed in a first sputter reactor of sputtering copper into said hole to form a copper layer on walls of said hole; and a second step performed in a second sputter reactor of sputtering copper into said hole to fill said hole.

16. The method of claim 15, wherein said first step is performed while holding said substrate at a first temperature and wherein said second step is performed while holding said substrate at a second temperature higher than said first temperature and in a range between 200° and 600° C. and wherein said second temperature is increased while said second step is sputtering copper into said hole.

17. The method of claim 15, wherein said second step is performed while holding said substrate at a temperature in a range between 200° and 600° C.

18. The method of claim 17, wherein said temperature is in a range of between 300° and 500° C.

19. The method of claim 17, wherein said temperature is increased while said second step is sputtering copper into said hole.

20. The method of claim 15 wherein said first step comprises inductively coupling RF power into said first sputter reactor.

21. The method of claim 15, wherein said first step includes inductively coupling power into said first sputter reactor and wherein said second step does not include inductively coupling power into said second sputter reactor.

22. The method of claim 15, wherein said second step produces an ionization fraction less than 10% of copper sputtered from a copper target in said second sputter reactor.

23. The method of claim 15 wherein said first step is performed while holding said substrate at a first temperature and wherein said second step is performed while holding said substrate at a second temperature higher than said first temperature and in a range between 300° C. and 500° C.

24. The method claim 15, wherein said copper layer is deposited to a thickness of between 20 and 100 nm.

25. A method of depositing copper into a hole formed in a substrate, comprising the steps of:

a first step of depositing by chemical vapor deposition a first copper layer on walls of said hole; and a second step of depositing by physical vapor deposition a second copper layer on said first copper layer to fill said hole.

26. The method of claim 25, wherein said second step includes maintaining a temperature of said substrate at between 200° and 600° C.

27. The method of claim 26, wherein said second temperature is between 300° and 500° C.

* * * * *